United States Patent
Yamanaka

(10) Patent No.: US 8,476,984 B2
(45) Date of Patent: Jul. 2, 2013

(54) VIBRATION DEVICE, OSCILLATOR, AND ELECTRONIC APPARATUS

(75) Inventor: Kunihito Yamanaka, Kamiina (JP)

(73) Assignee: Seiko Epson Corporation (JP)

( * ) Notice: Subject to any disclaimer, the term of this patent is extended or adjusted under 35 U.S.C. 154(b) by 23 days.

(21) Appl. No.: 13/312,276

(22) Filed: Dec. 6, 2011

(65) Prior Publication Data

US 2012/0139652 A1    Jun. 7, 2012

(30) Foreign Application Priority Data

Dec. 7, 2010    (JP) ................................. 2010-272914

(51) Int. Cl.
*H03B 5/32* (2006.01)
*H03H 9/02* (2006.01)

(52) U.S. Cl.
USPC ............... 331/107 A; 310/313 B; 331/176; 331/158

(58) Field of Classification Search
USPC ........................................... 331/107 A, 158
See application file for complete search history.

(56) References Cited

U.S. PATENT DOCUMENTS

| | | | |
|---|---|---|---|
| 4,387,355 A | 6/1983 | Uno et al. | |
| 5,179,310 A | 1/1993 | Satoh et al. | |
| 6,154,105 A | 11/2000 | Fujimoto et al. | |
| 6,329,888 B1 | 12/2001 | Hirota | |
| 6,414,414 B1 | 7/2002 | Wright | |
| 6,774,747 B2 | 8/2004 | Yamazaki et al. | |
| 6,784,595 B2 | 8/2004 | Iizawa et al. | |
| 6,856,218 B2 | 2/2005 | Yamazaki et al. | |
| 7,847,647 B2 | 12/2010 | Martin et al. | |
| 2002/0171512 A1 | 11/2002 | Kadota et al. | |
| 2004/0201306 A1 | 10/2004 | Yamanouchi | |
| 2005/0127781 A1 | 6/2005 | Yamazaki et al. | |
| 2006/0108894 A1 | 5/2006 | Kanna | |
| 2006/0145568 A1 | 7/2006 | Morita et al. | |
| 2007/0182278 A1 | 8/2007 | Kanna | |
| 2009/0206955 A1 | 8/2009 | Iizawa | |
| 2010/0219913 A1 | 9/2010 | Yamanaka | |
| 2010/0244626 A1 | 9/2010 | Yamanaka | |
| 2012/0068573 A1* | 3/2012 | Obata | ........................ 310/313 A |

FOREIGN PATENT DOCUMENTS

| | | |
|---|---|---|
| JP | 54-156455 | 12/1979 |
| JP | 57-005418 | 1/1982 |
| JP | 57-099813 | 6/1982 |

(Continued)

OTHER PUBLICATIONS

Shimizu, Tasutaka et al., "A New Cut of Quartz for SAW With More Stable Temperature Characteristics", Tokyo Institute of Technology and Nippon Electric Co., Ltd., Mar. 26, 1982, pp. 562-563.

(Continued)

*Primary Examiner* — Joseph Chang
(74) *Attorney, Agent, or Firm* — Harness, Dickey & Pierce, P.L.C.

(57) ABSTRACT

A vibration device includes: a first vibrator having a 3rd-order function temperature characteristic in which a 3rd-order temperature coefficient is $-\gamma_1$, where $\gamma_1>0$; and a second vibrator which is connected to the first vibrator, and has a 3rd-order function temperature characteristic in which a 3rd-order temperature coefficient is $\gamma_2$, where $\gamma_2>0$, wherein a difference between inflection points of the first and second vibrators is equal to or lower than 19° C., and a relationship of $0<|\gamma_1| \leq |2.4\gamma_2|$ is satisfied.

11 Claims, 8 Drawing Sheets

FOREIGN PATENT DOCUMENTS

| | | |
|---|---|---|
| JP | 58-033309 | 2/1983 |
| JP | 61-092011 | 5/1986 |
| JP | 61-220513 | 9/1986 |
| JP | 61-220514 | 9/1986 |
| JP | 01-231412 | 9/1989 |
| JP | 02-189011 | 7/1990 |
| JP | 03-284009 | 12/1991 |
| JP | 05-090865 | 4/1993 |
| JP | 10-270974 | 10/1998 |
| JP | 11-214958 | 8/1999 |
| JP | 11-298290 | 10/1999 |
| JP | 2000-188521 | 7/2000 |
| JP | 2002-100959 | 4/2002 |
| JP | 2002-517933 | 6/2002 |
| JP | 2002-330051 | 11/2002 |
| JP | 2003-124780 | 4/2003 |
| JP | 2003-152487 | 5/2003 |
| JP | 2003-258601 | 9/2003 |
| JP | 2005-012736 | 1/2005 |
| JP | 2005-204275 | 7/2005 |
| JP | 2006-074136 | 3/2006 |
| JP | 2006-148622 | 6/2006 |
| JP | 2006-186623 | 7/2006 |
| JP | 2006-203408 | 8/2006 |
| JP | 2006-295311 | 10/2006 |
| JP | 2006-339742 | 12/2006 |
| JP | 2007-028664 | 2/2007 |
| JP | 2007-142794 | 6/2007 |
| JP | 2007-208871 | 8/2007 |
| JP | 2007-259414 | 10/2007 |
| JP | 2007-267033 | 10/2007 |
| JP | 2007-281701 | 10/2007 |
| JP | 2007-300174 | 11/2007 |
| JP | 2007-300287 | 11/2007 |
| JP | 2008-078984 | 4/2008 |
| JP | 2008-236295 | 10/2008 |
| JP | 2009-225420 | 10/2009 |
| JP | 2009-540640 | 11/2009 |
| JP | 2010-233203 | 10/2010 |
| WO | 2010/098139 | 9/2010 |

OTHER PUBLICATIONS

Takehiko Uno et al., "Fabrication of SAW Resonators With Groove Gratings and Their Characteristics", Electrical Communication Laboratories, NTT, pp. 45-52.

Martin, G et al., "Improved Temperature Stability of One-Port SAW Resonators Achieved Without Coils", Leibniz Institute for Solid State and Materials Research, Vectron International Telefilter, 2007, pp. 925-928.

* cited by examiner

VIBRATION DEVICE, OSCILLATOR, AND ELECTRONIC APPARATUS

BACKGROUND

1. Technical Field

The invention relates to a vibration device, an oscillator having the same, and an electronic apparatus, and more particularly, to a vibration device, an oscillator, and an electronic apparatus with an excellent frequency-temperature characteristic.

2. Related Art

In a piezoelectric device, particularly, a surface acoustic wave (SAW) device, it is known that a frequency-temperature characteristic is improved by using resonance in a top end mode of a stop band.

As disclosed in Pamphlet of International Publication No. 2010-098139, it is conceivable to provide a SAW resonator in which a groove is provided between electrode fingers of the IDT when the IDT capable of excitation in the top end mode of a stop band is formed on a quartz substrate cut to a specific cutting angle, and a groove depth G or a line occupancy η of an electrode finger is appropriately set. If the SAW resonator is manufactured according to the conditions described in Pamphlet of International Publication No. 2010-098139, it is possible to obtain an excellent frequency-temperature characteristic and improve an environmental-resistant property and a Q value.

There is known a technique of combining two frequency-temperature characteristics by electrically connecting two SAW resonators to improve a frequency-temperature characteristic. For example, in the technique disclosed in JP-A-9-298446, the frequency-temperature characteristic curve obtained in the combined state is flattened by horizontally combining two SAW resonators having different peak temperatures on a 2nd-order function temperature characteristic. In addition, as disclosed in G. Martin, H. Schmidt B. Wall "IMPROVED TEMPERATURE STABILITY OF ONE-PORT SAW RESONATORS ACHIEVED WITHOUT COILS", 2007 IEEE Ultrasonics Symposium, p 925-928, it is conceivable to connect two single-port SAW resonators successively to improve the frequency-temperature characteristic. Specifically, inductors are connected to each single-port SAW resonator in parallel, or the corresponding inductor is excluded (a parallel capacitor may be included).

Using the piezoelectric device having the aforementioned configuration, it is possible to improve the frequency-temperature characteristic compared to the SAW device in the related art. However, although the SAW device disclosed Pamphlet of International Publication No. 2010-098139 has a 3rd-order temperature characteristic, the frequency variation is within ±25 ppm in a temperature range of −40° C. to +85° C. In the SAW devices disclosed in JP-A-9-298446 and proposed by G. Martin et al., the frequency variation increases further.

SUMMARY

An advantage of some aspects of the invention is to provide a vibration device, an oscillator having the vibration device, and an electronic apparatus capable of further improving the frequency-temperature characteristic at an operational temperature range (for example, from −40° C. to +85° C.) compared to the related art.

Application Example 1

This application example of the invention is directed to a vibration device including: a first vibrator having a 3rd-order function temperature characteristic in which a 3rd-order temperature coefficient is $-\gamma_1$, where $\gamma_1>0$; and a second vibrator which is connected to the first vibrator, and has a 3rd-order function temperature characteristic in which a 3rd-order temperature coefficient is $\gamma_2$, where $\gamma_2>0$, wherein a difference between inflection points of the first and second vibrators is equal to or lower than 19° C., and a relationship of $0<|\gamma_1|\leq|2.4\gamma_2|$ is satisfied.

In the vibration device having such a configuration, it is possible to further improve the frequency variation within the operational temperature range compared to the related art.

Application Example 2

This application example of the invention is directed to the vibration device according to Application Example 1, wherein the first and second vibrators are provided on a quartz substrate with an Euler angle of $(-1.5°\leq\phi\leq+1.5°, 117°\leq\theta\leq142°, 42.79°\leq|\psi|\leq49.75°$ to constitute a surface acoustic wave resonator for exciting a surface acoustic wave in a top end mode of a stop band, a groove is provided between electrode fingers of an excitation electrode for exciting the surface acoustic wave, and a relationship $G_1<G_2$ is satisfied, where $G_1$ denotes a groove depth between the electrode fingers in the first vibrator, and $G_2$ denotes a groove depth between the electrode fingers in the second vibrator.

In the vibration device having such a configuration, it is possible to manufacture the device using the substrate having the same cut angle.

Application Example 3

This application example of the invention is directed to the vibration device according to Application Example 2, wherein the first and second vibrators are provided on a single piezoelectric substrate.

In the vibration device having such a configuration, it is possible to manufacture a device having little frequency variation as a single element.

Application Example 4

This application example of the invention is directed to the vibration device according to Application Example 3, wherein a height difference is provided on the piezoelectric substrate, and the height difference is provided between the first and second vibrators as the piezoelectric substrate is seen in a plan view.

In the vibration device having such a configuration, it is possible to suppress the unnecessary wave transmission between the first and second vibrators at the height difference portion. In addition, it is possible to reduce the unnecessary acoustic couplings between the first and second vibrators.

Application Example 5

This application example of the invention is directed to the vibration device according to any of Application Examples 1 to 4, wherein the first and second vibrators are electrically connected in parallel.

Application Example 6

This application example of the invention is directed to the vibration device according to Application Example 5, wherein a capacitor is electrically connected in parallel to the first and second vibrators electrically connected in parallel.

In the vibration device having such a configuration, it is possible to change the coupling degree between the first and second vibrators depending on the capacity of the capacitor.

Application Example 7

This application example of the invention is directed to the vibration device according to any of Application Examples 1 to 4, wherein the first and second vibrators are electrically connected in series.

Application Example 8

This application example of the invention is directed to the vibration device according to Application Example 7, wherein an inductor is electrically connected in parallel to each of the first and second vibrators electrically connected in series.

In the vibration device having such a configuration, it is possible to change the coupling degree between the first and second vibrators by changing the value of the inductor.

Application Example 9

This application example of the invention is directed to an oscillator having an oscillation circuit and the vibration device according to any of Application Examples 1 to 8.

In the oscillator having such a configuration, it is possible to obtain effects based on the aforementioned configuration, realize high-precision oscillation within a wide operational temperature range, and improve reliability.

Application Example 10

This application example of the invention is directed to an electronic apparatus having the vibration device according to any of Application Examples 1 to 8.

In the electronic apparatus having such a configuration, it is possible to provide a high-reliability electronic apparatus within a wide operational temperature range.

Application Example 11

This application example of the invention is directed to a method of manufacturing a vibration device. The method includes: manufacturing a first vibrator having a 3rd-order function temperature characteristic in which a 3rd-order function temperature coefficient is $-\gamma_1$, where $\gamma_1>0$; manufacturing a second vibrator having a 3rd-order function temperature characteristic in which a 3rd-order temperature coefficient is $-\gamma_2$, where $\gamma_2>0$; selecting a combination of the first and second vibrators, from a first vibrator group and a second vibrator group which are manufactured, satisfying a relationship of $0<|\gamma_1|\leq|2.4\gamma_2|$ and having a difference between inflection points equal to or lower than 19° C.; and connecting the selected first and second vibrators.

In the method of manufacturing the vibration device having such a configuration, it is possible to appropriately combine the first and second vibrators with an excellent frequency-temperature characteristic. As a result, it is possible to improve a product yield by reducing defects after manufacturing.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a vibration device, an oscillator, and an electronic apparatus according to embodiments of the invention will be described in detail with reference to the accompanying drawings. In the present embodiment, description will be made of a piezoelectric device as an example of a vibration device, particularly, a surface acoustic wave device (hereinafter, simply referred to as a SAW device).

Figure 1:
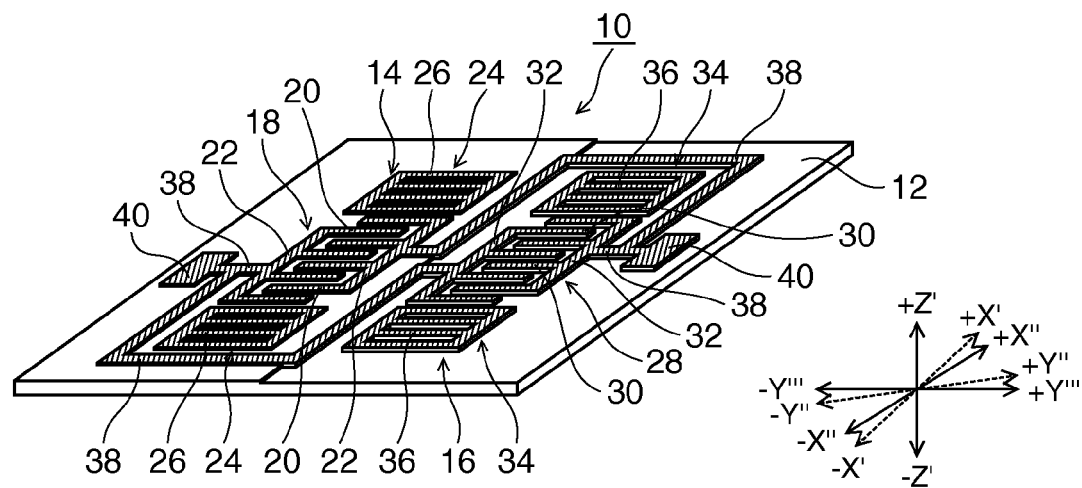
FIG. 1 is a perspective view illustrating a configuration of an SAW device according to an embodiment.

As shown in FIG. 1, the surface acoustic wave device (hereinafter, simply referred to as SAW device 10) according to the present embodiment basically includes a quartz substrate 12 and two SAW resonators (first and second resonators (first and second vibrators) 14 and 16) formed on the quartz substrate 12. The first and second resonators 14 and 16 basically include the IDTs 18 and 28 and the reflectors 24 and 34, respectively, and are connected to an I/O electrode 40 through an extraction electrode 38.

The quartz substrate 12 employs an in-plane rotated ST-cut quartz substrate having an Euler angle representation of $(-1.5°\leq\phi\leq+1.5°, 117°\leq\theta\leq142°,$ and $42.79°\leq|\psi|\leq49.75°)$. In addition, the substrate having an Euler angle $(0°, 0°, 0°)$ is a Z-cut substrate having a principal surface perpendicular to the Z axis. Here, $\phi$ of the Euler angle $(\phi, \theta, \psi)$ relates to a first rotation of the Z-cut substrate, and $\phi$ is a first rotation angle represented as a positive rotation angle in a rotation direction from +X axis to +Y axis with respect to the Z axis. θ relates to a second rotation performed after the first rotation of the Z-cut substrate and is a second rotation angle represented as a positive rotation angle in a rotation direction from the +Y axis (=+Y' axis) subjected to the first rotation to the +Z axis with respect to the X axis (=X' axis) subjected to the first rotation. The cut surface of the piezoelectric substrate is determined by the first rotation angle φ and the second rotation angle θ. ψ relates to a third rotation performed after the second rotation of the Z-cut substrate and is a third rotation angle represented as a positive rotation angle in a rotation direction from the +X axis (=+X' axis) subjected to the second rotation to the +Y axis (+Y" axis) subjected to the second rotation with respect to the Z axis(=+ Z' axis) subjected to the second rotation. The propagation direction of the SAW is represented as the third rotation angle ψ against the X axis (=X' axis) subjected to the second rotation.

In the present embodiment, the IDTs 18 and 28 are formed on a single quartz substrate 12. Each of the IDTs 18 and 28 includes a pair of pectinate electrodes. The pectinate electrode is made by connecting the base end portions of a plurality of the electrode fingers 20 and 30 to the bus bars 22 and 32, respectively. The IDTs 18 and 28 are configured by arranging the electrode fingers 20 and 30 in the pectinate electrode to mesh with each other and interlacing the pectinate electrodes such that a predetermined interval is provided between the adjacent electrode fingers 20 and 30. In the present embodiment, the extending direction of the electrode fingers 20 and 30 included in the pectinate electrode from the bus bars 22 and 32 is provided to be perpendicular to the X' axis inclined from the X axis which is a crystal axis of the quartz. The SAW excited by the first and second resonators 14 and 16 is a Rayleigh type SAW and has a vibration displacement component in both the Z' axis and the X" axis. In this manner, it is possible to excite the SAW of the top end mode of the stop band by deviating the propagation direction of the SAW from the X axis which is a crystal axis of the quartz. The inventors verified that it is possible to obtain the frequency-temperature characteristic that can be expressed as a 3rd-order function in the SAW resonator by expressing the cut angle of the quartz substrate as the Euler angle representation ($-1.5° \leq \phi \leq +1.5°$, $117° \leq \theta \leq 142°$, and $42.79° \leq |\psi| \leq 49.75°$) and using the top end mode of the stop band.

The reflectors 24 and 34 are provided such that each of the IDTs 18 and 28 is inserted into the propagation direction of the SAW. Specifically, both ends of a plurality of the conductor strips 26 and 36 provided in parallel with the electrode fingers 20 and 30 of the IDTs 18 and 28 are connected to each other. The position for connecting each of a plurality of the conductor strips 26 and 36 does not need to be at both ends. Only a single end may be connected, or connection may be made at any location between one end and the other end, and the like.

In addition, the reflector is not necessary in the edge reflection type SAW resonator in which a reflection wave from the edge of the SAW propagation direction of the quartz substrate 12 is actively used or the multiple pairs of IDT type SAW resonators in which a standing wave of the SAW is excited by the IDT itself by increasing the number of pairs of the electrode fingers of the IDT.

The I/O electrode 40 is a pattern electrode provided with a pair of electrodes including the input (or output) port electrode and the output (or input) port electrode.

An extraction electrode 38 is a pattern electrode for electrically connecting two IDTs 18 and 28, with a pair of I/O electrodes 40 in parallel. In the present embodiment, the extraction electrode 38 is arranged such that the phases of both SAWs excited in two IDTs 18 and 28 match or approximately match each other due to a voltage applied through the I/O electrode 40. Aluminum (Al) or an alloy thereof may be used as a material of the pattern electrode included in the IDTs 18 and 28, the reflectors 24 and 34, the I/O electrode 40, and the extraction electrode 38, and the like.

In the SAW device 10 according to the present embodiment, the grooves are provided between a plurality of the electrode fingers 20 of the IDT 18 (specifically, pectinate electrode) and between a plurality of the electrode fingers 30 of the IDT 28. The groove depth G affects the 3rd-order temperature coefficient γ of the SAW device. Generally, it is known that the frequency-temperature characteristic is improved as the value (absolute value) of the 3rd-order temperature coefficient decreases.

Figure 2:
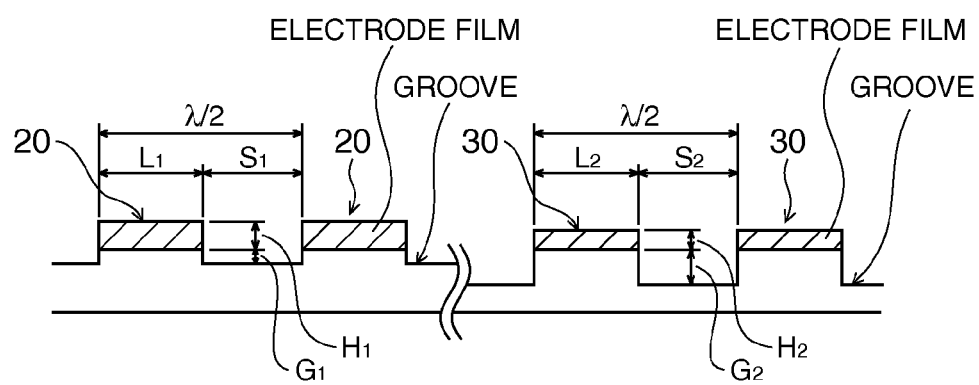
FIG. 2 is a cross-sectional view illustrating a relationship between groove depths $G_1$ and $G_2$, electrode film thicknesses $H_1$ and $H_2$, electrode-finger widths $L_1$ and $L_2$, groove widths $S_1$ and $S_2$, and a wavelength $\lambda$ of first and second resonators in the SAW device according to the embodiment.

FIG. 2 is a partially enlarged cross-sectional view illustrating an electrode finger 20 included in the IDT 18 and an electrode finger 30 included in the IDT 28 in the SAW device 10 according to the present embodiment of FIG. 1. λ in FIG. 2 denotes a wavelength of the SAW in the IDTs 18 and 28. In addition, $L_1$ denotes the width of the electrode finger 20, and $L_2$ denotes the width of the electrode finger 30. $S_1$ and $S_2$ denote the groove width formed between the adjacent electrode fingers 20 and the groove width formed between the adjacent electrode fingers 30, respectively. In addition, $G_1$ and $G_2$ denote the groove depth in the electrode fingers 20 and the groove depth in the electrode fingers 30, respectively. $H_1$ and $H_2$ denote the electrode thickness in the electrode fingers 20 and the electrode thickness in the electrode fingers 30, respectively. The line occupancy η ($\eta_1$ and $\eta_2$) described below is a value obtained by dividing the electrode finger width L ($L_1$ and $L_2$) by the pitch λ/2 (equal to $L_1+S_1$ or $L_2+S_2$) between the electrode fingers.

Figure 3:
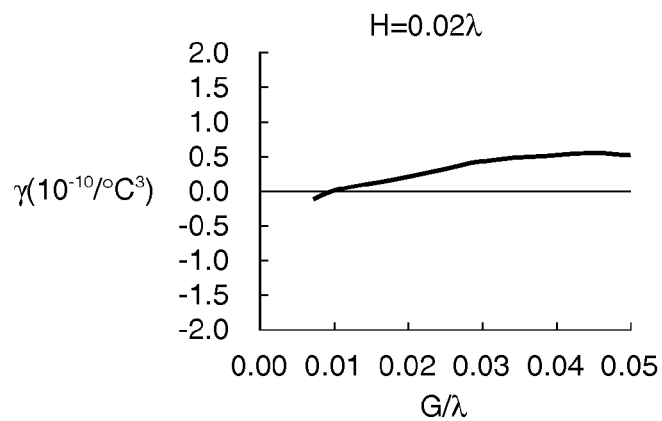
FIG. 3 is a graph illustrating a relationship between the groove depth G and the 3rd-order temperature coefficient $\gamma$ in a case where an electrode film thickness H is $0.02\lambda$.
Figure 4:
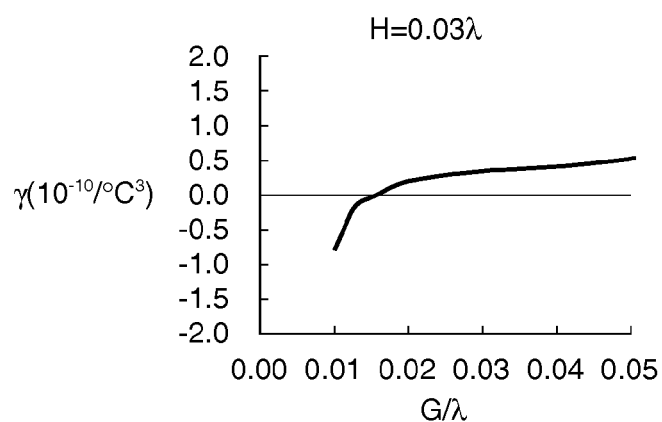
FIG. 4 is a graph illustrating a relationship between the groove depth G and the 3rd-order temperature coefficient $\gamma$ in a case where an electrode film thickness H is $0.03\lambda$.
Figure 5:
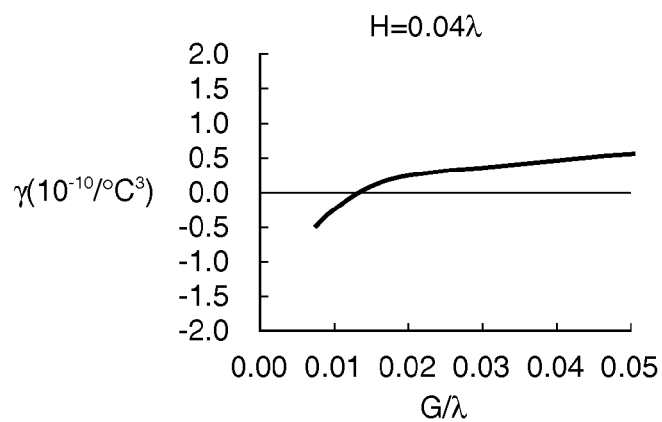
FIG. 5 is a graph illustrating a relationship between the groove depth G and the 3rd-order temperature coefficient $\gamma$ in a case where an electrode film thickness H is $0.04\lambda$.

A relationship between the 3rd-order temperature coefficient γ and the groove depth G can be represented using the graph illustrated in FIGS. 3 to 5 through simulation by appropriately selecting the angle capable of providing the best frequency-temperature characteristic within a range of |42° to 45°| for ψ indicating a third rotation angle in the Euler angle representation. In FIGS. 3 to 5, the abscissa denotes a ratio of the groove depth G to the wavelength λ of the surface acoustic wave, and the ordinate denotes a value of the 3rd-order temperature coefficient γ. FIG. 3 is a graph illustrating the example in a case where the electrode thickness H of the excitation electrode is set to 0.02λ. FIG. 4 is a graph illustrating the example in which the electrode thickness H of the excitation electrode is set to 0.03λ. FIG. 5 is a graph illustrating the example in which the electrode thickness H of the excitation electrode is set to 0.04λ.

Referring to FIG. 3 in which the electrode thickness H is set to 0.02λ, it is recognized that the positive and negative polarities of the 3rd-order temperature coefficient are reversed in the vicinity of a groove depth G of 0.01λ.

Referring to FIG. 4 in which the electrode thickness H is set to 0.03λ, it is recognized that the positive and negative polarities of the 3rd-order temperature coefficient are reversed in the vicinity of a groove depth G of 0.015λ.

Referring to FIG. 5 in which the electrode thickness H is set to 0.04λ, it is recognized that the positive and negative polarities of the 3rd-order temperature coefficient are reversed in the vicinity of a groove depth G of 0.013λ.

Through simulation illustrated in FIGS. 3 to 5, it is recognized that, if the groove depth G is within a range of 0.01λ to 0.05λ, any 3rd-order temperature coefficient γ is within a range of $-0.1$ ($10^{-10}/° C.^3$) to $+0.1$ ($10^{-10}/° C.^3$). In addition, referring to FIGS. 3 to 5, it is recognized that the groove depth G is reduced when the 3rd-order temperature coefficient denotes a negative value compared to a case where the 3rd-order temperature coefficient denotes a positive value.

In addition, a simulation to obtain the graph illustrated in FIGS. 3 to 5 has been performed by modeling a SAW resonator having 210 pairs of the electrode fingers in the IDT and 97 conductor strips of the reflector (per side).

Figure 6:
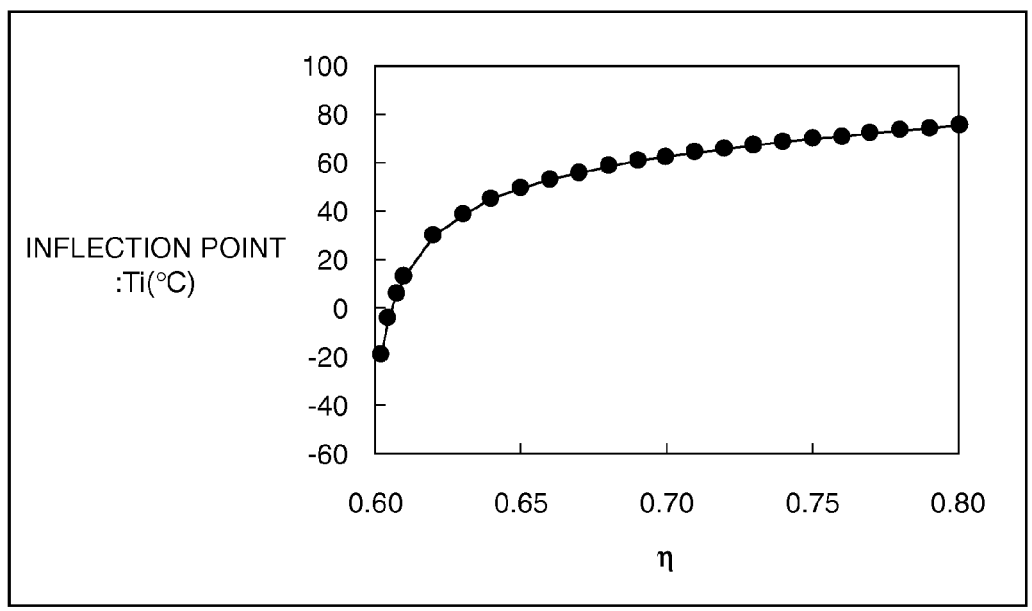
FIG. 6 is a graph illustrating a relationship between the line occupancy $\eta$ and the inflection point Ti.

In addition, a simulation was performed for a relationship between the line occupancy η and the inflection point Ti by modeling a SAW resonator having an electrode thickness of 0.02λ and a groove depth G of 0.05λ by commonly setting the number of pairs of the electrode fingers and the number of the conductor strips. As a result, it was possible to obtain the graph of FIG. 6. Referring to FIG. 6, it is recognized that the value of the inflection point Ti logarithmically changes depending on a variation of the line occupancy η. It is also recognized that the change of the inflection point Ti is steep when the line occupancy η is lower than 0.63, and the change is gradual when the line occupancy η is equal to greater than 0.63. The inflection point Ti may be changed by the line occupancy η even when the groove depth G is not set to 0.05λ.

As a result, it is possible to reverse the 3rd-order curve representing the frequency-temperature characteristic by differently setting the groove depth G between the electrode fingers 20 and 30 of the IDTs 18 and 28 between the first and second resonators 14 and 16 and reversing the sign of the 3rd-order temperature coefficient.

It is possible to control the inflection point Ti which can be read from the 3rd-order curve representing the frequency-temperature characteristic by adjusting the line occupancy η.

Therefore, it is possible to obtain a frequency-temperature characteristic having little frequency variation, that is, a flat frequency-temperature characteristic, by reversing the polarities of the signs of the 3rd-order temperature coefficients of the frequency-temperature characteristic in the first resonator 14 and the frequency-temperature characteristic of the second resonator 16 and combining them. Here, $\gamma_1$ and $\gamma_2$ satisfy a condition of $\gamma_1 > 0$ and $\gamma_2 > 0$, respectively, where $-\gamma_1$ denotes a 3rd-order temperature coefficient in the first resonator 14, and $\gamma_2$ denotes a 3rd-order temperature coefficient in the second resonator 16. If the 3rd-order temperature coefficient in the first resonator 14 has a negative value, and the 3rd-order temperature coefficient in the second resonator 16 has a positive value as recognized from the graphs illustrated in FIGS. 3 to 5, a relationship between the groove depths $G_1$ and $G_2$ of the first and second resonators 14 and 16, respectively, may satisfy a relationship of $G_1 < G_2$.

Figure 7:
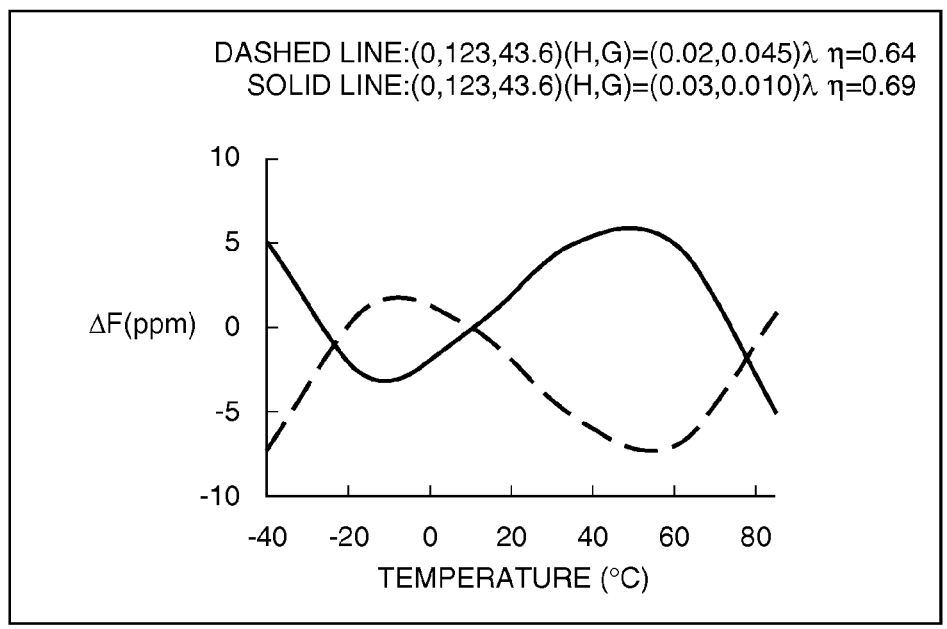
FIG. 7 is a graph illustrating a frequency-temperature characteristic of the first and second resonators under a specific condition.

The graph of FIG. 7 illustrates frequency-temperature characteristics of the first and second resonators 14 and 16 in the SAW device 10 using the quartz substrate 12 with the cut angle having an Euler angle representation (0°, 123°, 43.6°). In the example of FIG. 7, the electrode thickness $H_1$ of the IDT 18 in the first resonator 14 is set to 0.03λ, the groove depth $G_1$ is set to 0.010λ, and the line occupancy $\eta_1$ is set to 0.69 (solid lines in the drawings). Meanwhile, the electrode thickness $H_2$ of the IDT 28 in the second resonator 16 is set to 0.02λ, the groove depth $G_2$ is set to 0.045λ, and the line occupancy $\eta_2$ is set to 0.064 (dashed line in the drawings). In addition, FIG. 2 illustrates a relationship between the wavelength λ, the electrode thicknesses $H_1$ and $H_2$, and the groove depths $G_1$ and $G_2$, and a relationship between the groove widths $S_1$ and $S_2$ and the electrode finger widths $L_1$ and $L_2$ necessary to obtain the line occupancies $\eta_1$ and $\eta_2$.

Figure 8:
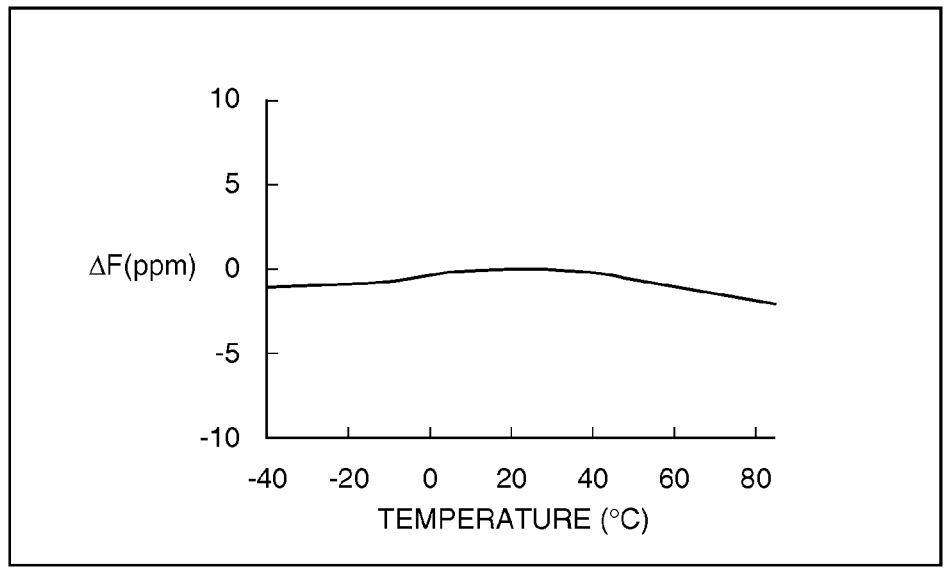
FIG. 8 is a graph illustrating a frequency-temperature characteristic obtained by combining frequency-temperature characteristics of the first and second resonators under a specific condition.

If the frequency-temperature characteristics of the first and second resonators 14 and 16 are combined as illustrated in FIG. 7, the frequency-temperature characteristic becomes that shown in FIG. 8. That is, the frequency variation is approximately set to 2.5 ppm within a temperature band of −40° C. to +85° C. Therefore, it can be said that the frequency-temperature characteristic of the SAW device 10 according to the present embodiment is remarkably improved compared to the SAW device of the related art.

However, in the SAW device 10 according to the present embodiment, the frequency-temperature characteristic in the SAW device 10 is obtained by combining the frequency-temperature characteristics of the first and second resonators 14 and 16. As a result, even when the slopes representing the frequency-temperature characteristics of the first and second resonators 14 and 16, that is, the 3rd-order temperature coefficients are equal, the frequency-temperature characteristic may be deteriorated if both the inflection points are deviated. Therefore, an acceptable range of the difference in temperature in the inflection points Ti between two SAW resonators will be examined.

Figure 9:
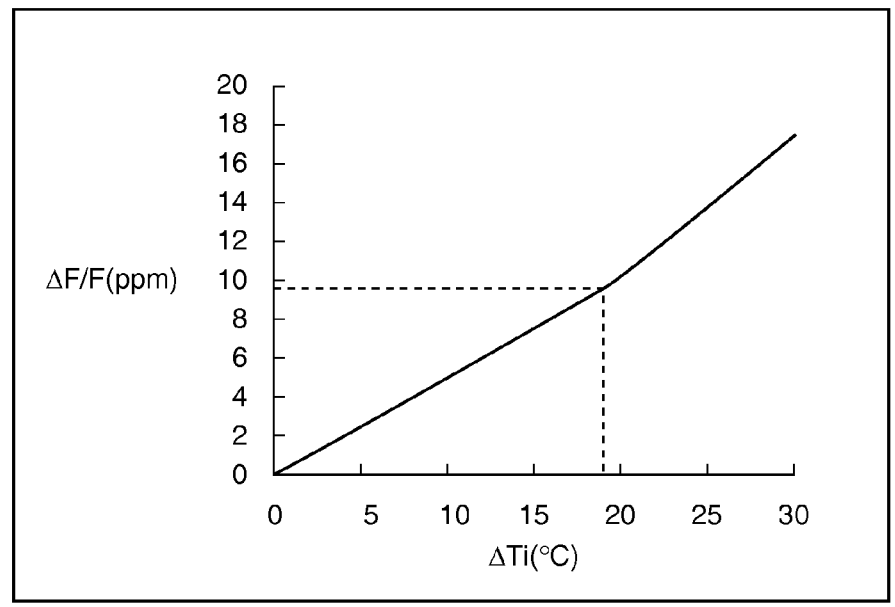
FIG. 9 is a graph illustrating a relationship between a frequency variation and a difference temperature of an inflection point Ti between two SAW resonators.

The graph illustrated in FIG. 9 shows a deviation amount of the inflection point Ti (a difference temperature of the inflection point) in the first and second resonators 14 and 16 representing the frequency-temperature characteristic in FIG. 8 (or FIG. 7) and a magnitude of the frequency variation generated by the deviation of the inflection point Ti. Referring to FIG. 9, it is recognized that the frequency variation of the frequency-temperature characteristic in the SAW device can be within 10 ppm if the difference temperature of the inflection point Ti is within 19° C. That is, if the difference temperature in the inflection point Ti is within 19° C., it is possible to further improve the frequency-temperature characteristic compared to the related art even when the 3rd-order temperature coefficient is significantly large.

In addition, of course, if the absolute values of the 3rd-order temperature coefficient $-\gamma_1$ in the first resonator 14 and the 3rd-order temperature coefficient $\gamma_2$ in the second resonator 16 are different, imbalance occurs when the frequency-temperature characteristics illustrated as the 3rd-order curve are combined. As a result, the frequency-temperature characteristic in the SAW device 10 is deteriorated. Therefore, an acceptable range for the relationship of the 3rd-order temperature coefficient γ between two SAW resonators will be examined.

Figure 10:
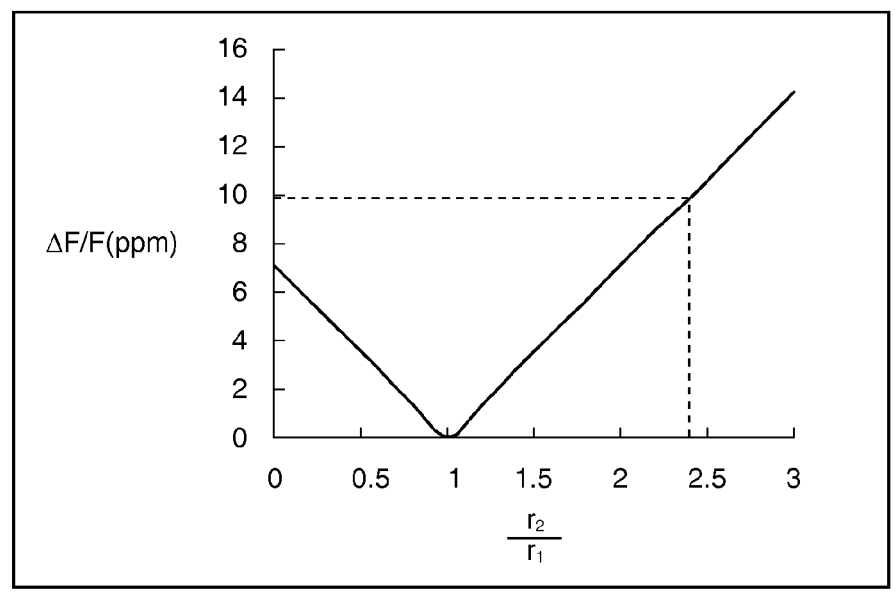
FIG. 10 is a graph illustrating a relationship between a frequency variation and a ratio of the 3rd-order temperature coefficient $\gamma$ between two SAW resonators.

FIG. 10 illustrates a graph representing the relationship between a ratio between the 3rd-order temperature coefficient $-\gamma_1$ in the first resonator 14 and the 3rd-order temperature coefficient $\gamma_2$ in the second resonator 16 and the frequency variation. Referring to FIG. 10, first, it is recognized that, if $\gamma_1$ is equal to $\gamma_2$, that is, $\gamma_1/\gamma_2 = 1$, the frequency variation becomes 0 ppm. In addition, referring to FIG. 10, it is recognized that, if $\gamma_1/\gamma_2 > 0$ and $\gamma_1/\gamma_2 \leq 2.4$, that is, $0 < |\gamma| \leq |2.4\gamma_2|$, the frequency variation in the combined frequency-temperature characteristic becomes within 10 ppm.

In the SAW device 10 of such a configuration, it is possible to remarkably improve the frequency-temperature characteristic compared to the related art because the frequency variation can be suppressed to be within 10 ppm in the operational temperature range of −40° C. to +85° C.

In addition, in FIG. 1, a difference is given to the groove depth G ($G_1$ and $G_2$) between the first and second resonators 14 and 16 by providing the height difference between the first and second resonators 14 and 16 as the single quartz substrate 12 is seen in a plan view. In such a configuration, it is possible to suppress the spurious wave transmitted between the first and second resonators 14 and 16 at the height difference portion. In addition, the height difference portion has an effect of reducing the unnecessary acoustic couplings between the first and second resonators 14 and 16.

Figure 11:
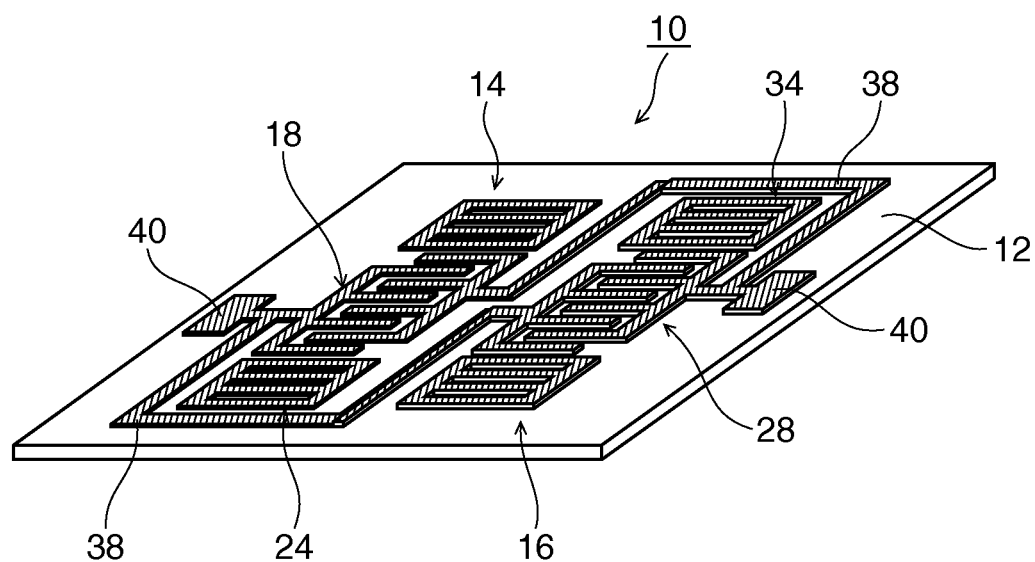
FIG. 11 is a perspective view illustrating a modification of the SAW device according to the embodiment.

However, a configuration of providing the height difference on the quartz substrate 12 is not indispensable. In the SAW device 10 according to the present embodiment, the groove depth G may be changed by flattening the quartz substrate and then, etching the electrode formation portion as illustrated in FIG. 11. In addition, in such a configuration, the height difference generated between two resonators may be positioned in the extraction electrode 38.

In the SAW device 10 according to the present embodiment, both the first and second resonators 14 and 16 are formed on a single quartz substrate 12. However, in the piezoelectric device according to the invention, the first and second resonators may be formed on different substrates and electrically connected to each other. Even in this configuration, it is possible to obtain the same effect.

Specifically, the method includes a process of manufacturing the first resonator in which the 3rd-order temperature coefficient in the design is set to $-\gamma_1$ and a process of manufacturing the second resonator in which the 3rd-order temperature coefficient in the design is set to $\gamma_2$. In addition, the manufacturing lines of the first and second resonators may be either the same or individual lines.

For each of the first and second resonator groups manufactured, the inflection point Ti and the 3rd-order temperature coefficient $\gamma$ are measured. Then, a combination is selected from the first and second resonator groups subjected to measurement of the inflection point Ti and the 3rd-order temperature coefficient $\gamma$, satisfying a condition that the difference between the inflection points Ti of two resonators is equal to or lower than 19° C. and a relationship $0<|\gamma_1|\leq|2.4\gamma_2|$ between the 3rd-order temperature coefficients $-\gamma_1$ and $\gamma_2$ in the first and second resonators. Here, it is preferable that a difference between the inflection points Ti of the selected two resonators is approximated to zero, and the absolute values of the 3rd-order temperature coefficient $-\gamma_1$ of the first resonator and the 3rd-order temperature coefficient $\gamma_2$ of the second resonator be approximated to each other.

After the first and second resonators are selected, the two resonators are electrically connected in parallel to the I/O electrode.

If the piezoelectric device is configured in this manner, a combination can be obtained to optimize a relationship of the difference between the inflection points Ti and the 3rd-order temperature coefficient $\gamma$ compared to a case where two resonators are formed on a single substrate. Therefore, it is possible to improve the product yield.

In the embodiment described above, the quartz substrate 12 is employed as the substrate. However, the piezoelectric device according to the invention does not necessarily use the quartz crystal as a material of the substrate if the 3rd-order temperature coefficient can be obtained. For example, lithium tantalate, lithium niobate, and the like capable of exciting the SAW may be used.

In the embodiments described above, both the first and second vibrators are described as the SAW resonator. However, any type of vibration device may be used according to the invention if the vibration device is a vibrator in which the frequency-temperature characteristic representing the 3rd-order curve, and the 3rd-order temperature coefficient $-\gamma_1$ of the first vibrator and the 3rd-order temperature coefficient $\gamma_2$ of the second vibrator satisfy a relationship of $0<|\gamma_1|\leq|2.4\gamma_2|$. For example, the first vibrator may be an AT-cut vibrator having the 3rd-order temperature coefficient $-\gamma_1$, and the second vibrator may be the SAW resonator having the 3rd-order temperature coefficient $\gamma_2$.

Figure 12:
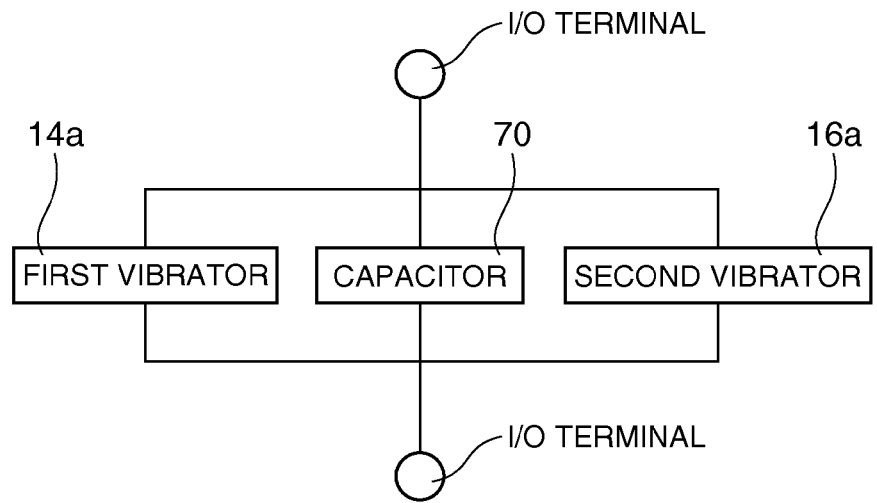
FIG. 12 is a circuit diagram illustrating a case where a capacitor is provided as an external element.

The vibration device according to the invention may be provided with a capacitor as illustrated in FIG. 12. In such a configuration, first and second vibrators 14a and 16a and the capacitor 70 may be connected in parallel to the input (or output) terminal and the output (or input) terminal. A coupling degree of the first and second vibrators 14a and 16a can be changed by the capacity of the capacitor 70 in such a configuration.

Figure 13:
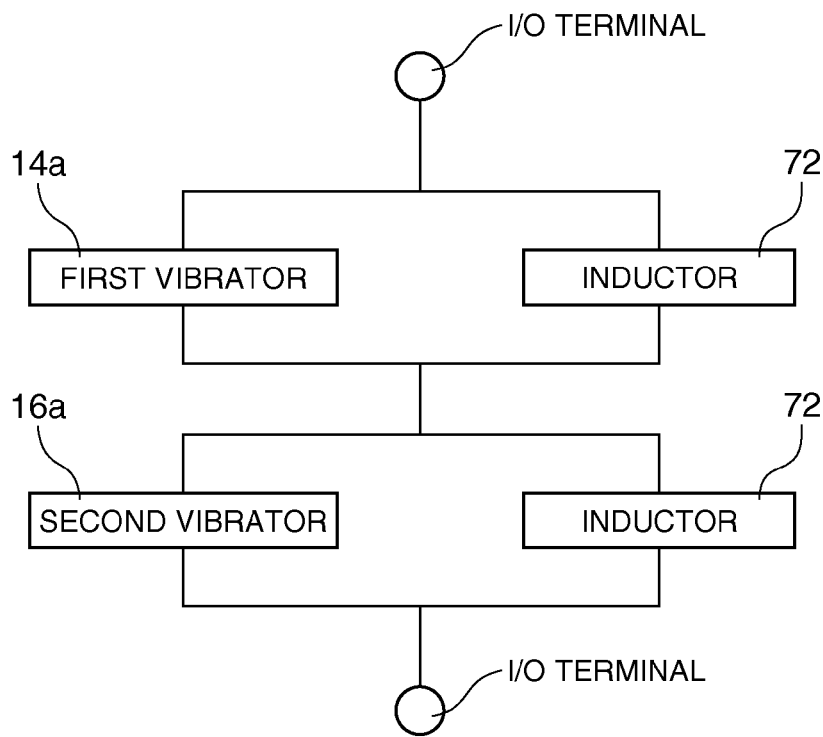
FIG. 13 is a circuit diagram illustrating a case where an inductor is provided as an external element.

In the vibration device according to the aforementioned embodiment, both the first vibrator (first resonator 14) and the second vibrator (second resonator 16) are electrically connected in parallel. However, in the vibration device according to the invention, the first and second vibrators 14a and 16a may be connected in series to the input (or output) terminal and output (or input) terminal as illustrated in FIG. 13. If such a connection type is employed, an inductor 72 may be provided in parallel with each of the first and second vibrators 14a and 16a as illustrated in the same drawing. If the inductor 72 is connected, it is possible to change the coupling degree for the first and second vibrators 14a and 16a by changing a value of the inductor 72.

Figure 14:
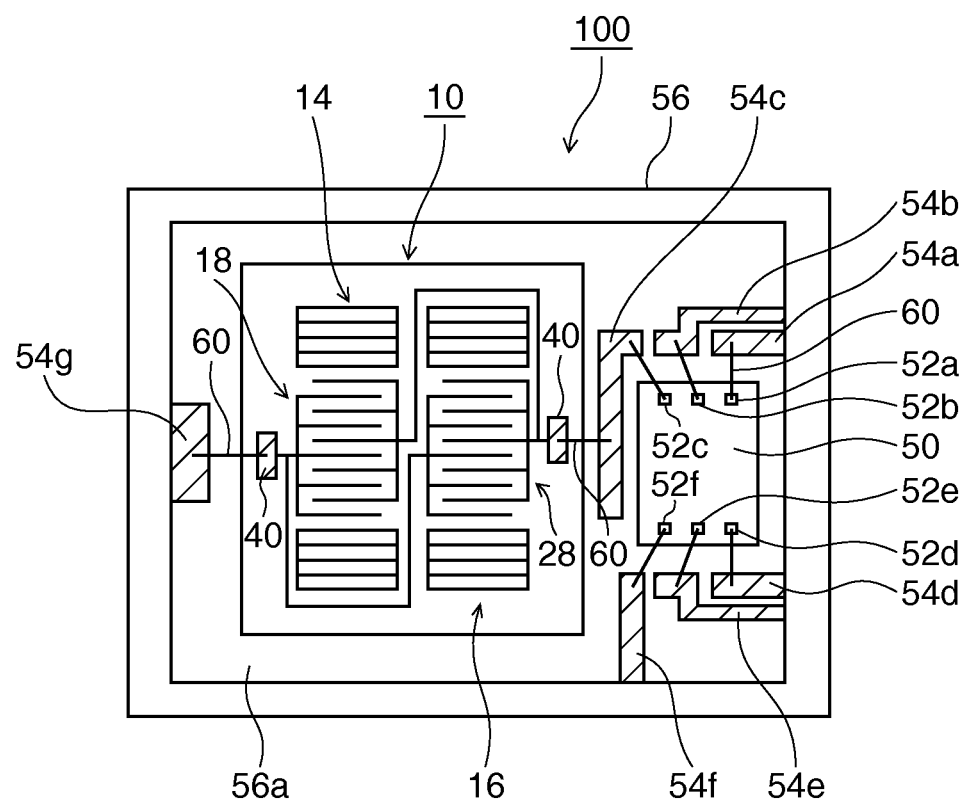
FIG. 14 is a plan view illustrating a configuration of an oscillator having a piezoelectric device according to the embodiment.

Next, the SAW oscillator according to the invention will be described with reference to FIG. 14. As shown in FIG. 14, the SAW oscillator according to the invention includes the aforementioned SAW device 10, an integrated circuit (IC) 50 for performing driving control by applying the voltage to the IDTs 18 and 28 of the first and second resonators 14 and 16, respectively, formed on this SAW device 10, and a package 56 for packaging them.

The SAW oscillator 100 according to the embodiment houses the SAW device 10 and the IC 50 in the same package 56, and electrode patterns 54a to 54g formed on a bottom surface 56a of the package 56, the I/O electrode 40 formed on the SAW device 10, and pads 52a to 52f of the IC 50 are connected by a metal wire 60. In addition, the cavity of the package 56 which houses the SAW device 10 and the IC 50 is hermetically sealed using the lid (not shown). In this configuration, it is possible to electrically connect the IDTs 18 and 28, the IC 50, and the external packaging electrode (not shown) formed on the bottom surface of the package 56.

The SAW resonator according to the invention may be used as a clock source in a mobile phone, a hard disk, a server computer, and a wired/wireless base station. The electronic apparatus according to the invention refers to such a mobile phone, a hard disk, and the like having the aforementioned SAW resonator.

In the aforementioned embodiments, description has been exemplarily made of the piezoelectric device for exciting the surface acoustic wave as a vibration device, and of the fact that it is possible to improve the frequency-temperature characteristic compared to the related art. However, the spirit of the invention may be applied to other driving types of vibration devices in addition to the piezoelectric type. For example, the invention may be similarly applied even in an electrostatic drive vibrator using a coulomb force or a MEMS vibrator using a silicon semiconductor if two vibrators have a 3rd-order function temperature characteristic, and the signs of the 3rd-order temperature coefficients are opposite to each other.

The entire disclosure of Japanese Patent Application No. 2010-272914, filed Dec. 7, 2010 is expressly incorporated by reference herein.

What is claimed is:
1. A vibration device comprising:
a first vibrator having a 3rd-order function temperature characteristic in which a 3rd-order temperature coefficient is $-\gamma_1$, where $\gamma_1>0$; and a second vibrator which is connected to the first vibrator, and has a 3rd-order function temperature characteristic in which a 3rd-order temperature coefficient is $\gamma_2$, where $\gamma_2 > 0$, wherein a difference between inflection points of the first and second vibrators is equal to or lower than 19° C., and a relationship of $0 < |\gamma_1| \leq |2.4\gamma_2|$ is satisfied.

2. The vibration device according to claim 1, wherein the first and second vibrators are provided on a quartz substrate with an Euler angle of ($-1.5° \leq \phi \leq +1.5°$, $117° \leq \theta \leq 142°$, $42.79° \leq |\psi| \leq 49.75°$) to constitute a surface acoustic wave resonator for exciting a surface acoustic wave in a top end mode of a stop band, a groove is provided between electrode fingers of an excitation electrode for exciting the surface acoustic wave, and a relationship $G_1 < G_2$ is satisfied, where $G_1$ denotes a groove depth between the electrode fingers in the first vibrator, and $G_2$ denotes a groove depth between the electrode fingers in the second vibrator.

3. The vibration device according to claim 2, wherein the first and second vibrators are provided on a single piezoelectric substrate.

4. The vibration device according to claim 3, wherein a height difference is provided on the piezoelectric substrate, and the height difference is provided between the first and second vibrators as the piezoelectric substrate is seen in a plan view.

5. The vibration device according to claim 1, wherein the first and second vibrators are electrically connected in parallel.

6. The vibration device according to claim 5, wherein a capacitor is electrically connected in parallel to the first and second vibrators electrically connected in parallel.

7. The vibration device according to claim 1, wherein the first and second vibrators are electrically connected in series.

8. The vibration device according to claim 7, wherein an inductor is electrically connected in parallel to each of the first and second vibrators electrically connected in series.

9. An oscillator including the vibration device according to claim 1 and an oscillator circuit.

10. An electronic apparatus having the vibration device according to claim 1.

11. A method of manufacturing a vibration device, the method comprising:

manufacturing a first vibrator having a 3rd-order function temperature characteristic in which a 3rd-order temperature coefficient is $-\gamma_1$, where $\gamma_1 > 0$;

manufacturing a second vibrator having a 3rd-order function temperature characteristic in which a 3rd-order temperature coefficient is $-\gamma_2$, where $\gamma_2 > 0$;

selecting a combination of the first and second vibrators, from first and second vibrator groups which are manufactured, satisfying a relationship of $0 < |\gamma_1| \leq |2.4\gamma_2|$ and having a difference between inflection points equal to or lower than 19° C.; and connecting the selected first and second vibrators.

* * * * *